United States Patent [19]
Yamamoto

[11] Patent Number: 5,744,857
[45] Date of Patent: Apr. 28, 1998

[54] SEMICONDUCTOR DEVICE

[75] Inventor: Yousuke Yamamoto, Tokyo, Japan

[73] Assignee: Mitsubishi Denki Kabushiki Kaisha, Tokyo, Japan

[21] Appl. No.: 694,625

[22] Filed: Aug. 9, 1996

[30] Foreign Application Priority Data

Jan. 30, 1996 [JP] Japan .................................. 8-014080

[51] Int. Cl.$^6$ ............................. H01L 29/06; H01L 27/15; H01L 31/12; H01L 33/00
[52] U.S. Cl. ............................. 257/622; 257/81; 257/99
[58] Field of Search .................................. 257/622, 624, 257/81, 98, 99, 625, 621

[56] References Cited

U.S. PATENT DOCUMENTS

| | | | |
|---|---|---|---|
| 5,119,174 | 6/1992 | Chen | 257/99 |
| 5,270,555 | 12/1993 | Ito et al. | 257/99 |
| 5,343,070 | 8/1994 | Goodrich et al. | 257/624 |
| 5,387,808 | 2/1995 | Nozu | 257/622 |
| 5,545,893 | 8/1996 | Brown et al. | 257/81 |

FOREIGN PATENT DOCUMENTS

| | | |
|---|---|---|
| 537005 | 2/1993 | Japan . |
| 563309 | 3/1993 | Japan . |

OTHER PUBLICATIONS

Yoshikawa et al., "Laser–Detector–Hologram Unit For Thin Optical Pick–up Head Of A CD Player", IEEE Transactions on Components, Packing, and Manufacturing Technology, vol. 18, No. 2, May 1995, pp. 14–18.

*Primary Examiner*—Mahshid D. Saadat
*Assistant Examiner*—S. V. Clark
*Attorney, Agent, or Firm*—Leydig, Voit & Mayer, Ltd.

[57] ABSTRACT

A semiconductor device includes a silicon substrate having a surface and a 20–150 μm deep recess produced at the surface by anisotropic etching, the recess having a bottom and a plurality of side walls; an electrode disposed on a region at the bottom of the recess, the region including an element region where a semiconductor element is to be mounted and a wire bonding region where a wire is to be bonded; a semiconductor element mounted on a portion of the electrode within the element region; and a wire bonded to a portion of the electrode within the wire bonding region. In this semiconductor device, since the electrode is disposed at the flat bottom of the recess, there is no difference in level, i.e., no step, in the region, where the electrode is disposed, between the element region and the wire bonding region. Therefore, unwanted breaking of the electrode is avoided, and degradation of characteristics due to such a breaking is avoided.

10 Claims, 12 Drawing Sheets

SEMICONDUCTOR DEVICE

FIELD OF THE INVENTION

The present invention relates to a semiconductor device and, more particularly, to a semiconductor light emitting device mounted on a silicon substrate.

BACKGROUND OF THE INVENTION

FIG. 12(a) is a plan view illustrating a prior art semiconductor device in which a laser diode is mounted on a silicon substrate, described in IEEE Transactions on Components, Packaging, and Manufacturing Technology—Part B, Vol. 18. No. 2, May 1995, and FIG. 12(b) is a cross-sectional view of the semiconductor device taken along line 12b—12b in FIG. 12(a).

In these figures, a silicon substrate 100 has a recess 1 at the surface and a convex portion 2 at the bottom of the recess 1. The depth of the recess 1 is 40 μm, and the height of the convex portion 2 is 10 μm. An electrode 3 is disposed on a region of the substrate 100 including the surface of the convex portion 2. A laser diode 8 is soldered to the electrode 3 on the convex portion 2 of the substrate 100 at its rear surface, whereby it is mounted on the substrate 100. The electrode 3 extends a wire bonding region 4 at the surface of the silicon substrate 100 outside the recess 1, and an Au wire 5a is bonded to the electrode 3 in the wire bonding region 4. Further, an Au wire 5b is bonded to the surface of the laser diode 8. When a forward bias voltage is applied across these wires 5a and 5b and a threshold current level is exceeded, laser light is emitted from the laser diode 8. Side walls of the recess 1 are composed of inclined planes 10, 11, and 12, and only the inclined plane 10 makes an angle of 45° with the bottom of the recess 1. Laser light is emitted from the laser diode 8 toward the inclined plane 10 and reflected upward by the plane 10, i.e., the reflected laser light becomes perpendicular to the surface of the silicon substrate 100. In this semiconductor device, the direction of the laser light emitted from the laser diode 8 can be made parallel to the surface of the silicon substrate 100, so that the laser diode can be mounted on the substrate 100 with the active layer parallel to the surface of the substrate, i.e., a planar mounting is realized.

A description is given of a method for fabricating the prior art semiconductor device. FIGS. 13(a)–13(d) are cross-sectional views illustrating process steps for fabricating the semiconductor device. First of all, the surface of the silicon substrate 100 is masked except a region where a recess is later formed, and the silicon substrate 100 is etched to form a recess 1. Thereafter, a resist 22 is formed on the surface of the silicon substrate outside the recess 1 and on a prescribed region at the bottom of the recess 1 (FIG. 13(a)). The silicon substrate 100 is wet etched using the resist 22 as a mask to form a convex portion 2 of the substrate 100 in the recess 1 (FIG. 13(b)). In the etching process, an overhanging portion 25 is easily formed at the upper edge of the recess 1. The reason is as follows. When the resist 22 is formed on the surface of the silicon substrate 100, the upper edge of the recess is covered with the resist 22 to prevent the surface of the substrate from being exposed due to an alignment error of the resist pattern. Since the silicon substrate 100 is wet etched using the resist 22 as a mask, the etching proceeds not only perpendicular to the surface of the substrate but also parallel to the surface, producing the overhanging portion 25.

After removal of the resist 22, a metal film 3, i.e., an electrode metal, is deposited on the entire surface by vacuum evaporation or sputtering. In this deposition process, as shown in FIG. 13(c), the metal film 3 is hardly deposited on a portion 26 just under the overhanging portion 25, resulting in breaking of the electrode at this portion.

In the step of FIG. 13(d), a portion of the metal film 3 is masked with a resist 21, and the metal film 3 is etched using the resist mask 21 to form an electrode comprising the metal film 3. However, since the depth of the recess 1 is 40 μm, it is difficult to form the resist 21 in a thickness sufficient to cover such a large difference in level, i.e., a high step, at the surface of the substrate 100 even when a high viscosity resist is employed. Therefore, as shown in FIG. 13(d), a portion 27 of the metal film 3 at an upper end of the inclined side surface in the recess 1 is easily exposed, and this portion 27 is unfavorably etched in the etching process of the metal film 3, resulting in breaking of the electrode at this portion.

In the prior art semiconductor device, as shown in FIG. 12(b), the electrode 3 is disposed on a region of the substrate 100 including the inclined side surface 12 in the recess 1 and the inclined side surface 71 of the convex portion 2, and the laser diode 8 and the wire bonding region 4 on the surface of the silicon substrate 100 are electrically connected to each other through the electrode 3 on these inclined surfaces 12 and 71. However, since the electrode 3 is easily broken on these inclined surfaces 12 and 71 because of the steps of the recess 1 and the convex portion 2, it is difficult to make the electrical connection in these regions reliably.

Further, when the convex portion 2 is formed in the recess 1, the overhanging portion 25 is formed at the upper edge of the recess 1 as shown in FIG. 13(b), and this overhanging portion 25 causes breaking of the electrode metal 3 as shown in FIG. 13(c). Furthermore, when the electrode metal 3 is patterned to form an electrode, a portion 27 of the metal is easily exposed due to imperfect deposition of the resist mask 21 as shown in FIG. 13(d), resulting in breaking of the electrode at this portion.

SUMMARY OF THE INVENTION

It is an object of the present invention to provide a semiconductor device having no breaking of an electrode connecting a region where a laser diode is mounted and a region where a wire is bonded.

It is another object of the present invention to provide a method of fabricating the semiconductor device.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises a silicon substrate having a surface and a 20~150 μm deep recess produced at the surface by anisotropic etching, the recess having a bottom and a plurality of side walls; an electrode disposed on a region at the bottom of the recess, the region including an element region where a semiconductor element is mounted and a wire bonding region where a wire is bonded; a semiconductor element mounted on a portion of the electrode within the element region; and a wire bonded to a portion of the electrode within the wire bonding region. In this semiconductor device, since the electrode is disposed at the bottom of the recess, there is no difference in level, i.e., no step, in the region, where the electrode is disposed, between the element region and the wire bonding region. Therefore, unwanted breaking of the electrode in this region is avoided, and degradation of characteristics due to such a breaking is avoided.

According to a second aspect of the present invention, in the semiconductor device mentioned above, the substrate has a 5~20 μm high convex portion in the recess, and the electrode is disposed on the convex portion. In this semiconductor device, since the semiconductor element is mounted on the convex portion in the recess, the position of the semiconductor element from the bottom of the recess is heightened, whereby irregular reflection of laser light emitted from the semiconductor element at the bottom of the recess is avoided.

According to a third aspect of the present invention, in the semiconductor device mentioned above, the substrate has a 5~20 μm high convex portion in the recess, the electrode is disposed on the bottom of the recess including the convex portion, the semiconductor element is mounted on a portion of the electrode on the convex portion, and the wire is bonded to a portion of the electrode outside the convex portion. In this semiconductor device, since the convex portion is not present in the wire bonding region, the electrode is disposed on the flat bottom of the recess in the wire bonding region. Therefore, when the electrode is patterned using a resist mask, the resist does not remain on the periphery of the electrode in the wire bonding region, whereby the patterning precision of the electrode is improved.

According to a fourth aspect of the present invention, in the semiconductor device mentioned above, the surface of the silicon substrate is in a plane that is about 9° off from a (100) plane, the side walls of the recess are inclined planes including a plane forming an angle of 45° with the bottom of the recess, and the semiconductor element is a semiconductor light emitting element mounted on the electrode at such a position that light emitted from the element is parallel to the bottom of the recess and reflected at the 45° inclined plane to be perpendicular to the surface of the silicon substrate.

According to a fifth aspect of the present invention, a semiconductor device comprises a silicon substrate having a surface in a plane that is about 9° off from a (100) plane, and a 20~150 μm deep recess at the surface, the recess having a bottom and a plurality of side walls inclined at different angles with respect to the bottom of the recess; an electrode disposed on a region including an element region at the bottom of the recess where a semiconductor element is mounted, a wire bonding region at the surface of the substrate outside the recess where a wire is bonded, and one of the side walls having a smallest angle of inclination with respect to the bottom of the recess; a semiconductor element mounted a portion of the electrode within the element region; and a wire bonded to a portion of the electrode within the wire bonding region. Therefore, when the electrode is produced by patterning an electrode metal using a resist mask, since the inclined side wall on which the electrode metal is deposited has the smallest angle of inclination, the resist mask covers the side wall with good coverage. Therefore, unwanted exposure of the electrode metal due to poor coverage of resist as shown in FIG. 13(d) is avoided, whereby breaking of the electrode on the side wall is avoided.

According to a sixth aspect of the present invention, in the semiconductor device mentioned above, the electrode is disposed on a region including the element region, the wire bonding region, and two or more side walls of the recess including the side wall having the smallest angle of inclination. When a highly anisotropic deposition method, such as vacuum evaporation, is employed for deposition of an electrode metal on the silicon substrate, the thickness of the electrode metal is thinner on the inclined side wall than on the bottom of the recess. Therefore, the maximum level of current flowing through the electrode, i.e., the breakdown current, is lower on the inclined side wall than on other regions. In this semiconductor device, however, since the electrode is disposed over two or more side walls, the width of the electrode on the side walls is increased, whereby reduction in the breakdown current of the entire electrode is avoided.

According to a seventh aspect of the present invention, in the semiconductor device mentioned above, the substrate has a 5~20 μm high convex portion in the recess, and the element region is on the convex portion. In this semiconductor device, since the semiconductor element is mounted on the convex portion in the recess, the position of the semiconductor element from the bottom of the recess is heightened, whereby irregular reflection of laser light emitted from the semiconductor element at the bottom of the recess is avoided.

According to an eighth aspect of the present invention, in the semiconductor device mentioned above, the substrate has a 5~20 μm high convex portion at the bottom of the recess, and the convex portion abuts on the side wall having the smallest angle of inclination. Further, the electrode is disposed on a region including an element region on the convex portion, the side wall having the smallest angle of inclination and adjacent to the convex portion, and a wire bonding region at the surface of the substrate outside the recess and adjacent to the side wall having the smallest angle of inclination. In this semiconductor device, since the convex portion abuts on the inclined side wall on which the electrode is disposed, a step of the convex portion is not present between the inclined side wall and the convex portion. Further, when the convex portion is formed by etching with a resist mask, since the resist mask covers the inclined side wall, an overhanging portion as shown in FIGS. 13(b) and 13(c) is not produced on the side wall. Therefore, unwanted breaking of the electrode between the element region and the wire bonding region is avoided.

According to a ninth aspect of the present invention, a method of fabricating a semiconductor device comprises preparing a silicon substrate having a surface; forming a recess 20~150 μm deep at the surface of the silicon substrate by anisotropic etching; forming an electrode on a region at the bottom of the recess, the region including an element region where a semiconductor element is later mounted and a wire bonding region where a wire is later bonded; mounting a semiconductor element on a portion of the electrode within the element region; and bonding a wire to a portion of the electrode within the wire bonding region. In this method, since the electrode is formed at the bottom of the recess, there is no difference in level, i.e., no step, in the region, where the electrode is disposed, between the element region and the wire bonding region. Therefore, unwanted breaking of the electrode in this region is avoided, and degradation of characteristics due to such a breaking is avoided.

According to a tenth aspect of the present invention, in the method mentioned above, after formation of the recess and before formation of the electrode, masks are formed on the surface of the substrate outside the recess and on a portion at the bottom of the recess, and the silicon substrate is etched using the masks to form a 5~20 μm high convex portion of the substrate at the bottom of the recess and, thereafter, the electrode is formed on the convex portion. In this method, since the electrode is formed at the bottom of the recess, there is no difference in level, i.e., no step, in the region, where the electrode is disposed, between the element region and the wire bonding region. Therefore, unwanted breaking of the electrode in this region is avoided, and degradation of characteristics due to such a breaking is avoided. Furthermore, since the semiconductor element is mounted on the convex portion in the recess, the position of the semiconductor element from the bottom of the recess is heightened, whereby irregular reflection of laser light emitted from the semiconductor element at the bottom of the recess is avoided.

According to an eleventh aspect of the present invention, in the method mentioned above, after formation of the recess and before formation of the electrode, masks are formed on the surface of the substrate outside the recess and on a region at the bottom of the recess including the element region, and the silicon substrate is etched using the masks to form a 5~20 µm high convex portion of the substrate at the bottom of the recess and, thereafter, the electrode is formed on a region including the element region on the convex portion and the wire bonding region at the bottom of the recess outside the convex portion. In this method, since the convex portion is not formed in the wire bonding region, the electrode is formed on the flat bottom of the recess in the wire bonding region. Therefore, when the electrode is patterned using a resist mask, the resist does not remain on the periphery of the electrode in the wire bonding region, whereby the patterning precision of the electrode is improved.

According to a twelfth aspect of the present invention, in the method mentioned above, the silicon substrate has a surface in a plane that is about 9° off from a (100) plane, the recess is formed at the surface of the silicon substrate by etching the silicon substrate so that the recess have a plurality of inclined side walls and at least one of the inclined side walls form an angle of 45° with the bottom of the recess, and a semiconductor light emitting element is mounted on the electrode at such a position that light emitted from the element is parallel to the bottom of the recess and reflected at the 45° inclined side wall to be perpendicular to the surface of the substrate.

According to a thirteenth aspect of the present invention, a method of fabricating a semiconductor device comprises preparing a silicon substrate having a surface in a plane that is about 9° off from a (100) plane; forming a 20~150 µm deep recess at the surface of the silicon substrate by anisotropic etching so that the recess have a plurality of inclined side walls; forming an electrode on a region including an element region at the bottom of the recess where a semiconductor element is later mounted, a wire bonding region at the surface of the silicon substrate outside the recess where a wire is later bonded, and one of the inclined side walls that has a smallest angle of inclination with respect to the bottom of the recess; mounting a semiconductor element on a portion of the electrode within the element region; and bonding a wire to a portion of the electrode within the wire bonding region. In this method, when the electrode is produced by patterning an electrode metal using a resist mask, since the inclined side wall on which the electrode metal is deposited has the smallest angle of inclination, the resist mask covers the side wall with good coverage. Therefore, unwanted exposure of the electrode metal due to poor coverage of resist as shown in FIG. 13(d) is avoided, whereby breaking of the electrode on the side wall is avoided.

According to a fourteenth aspect of the present invention, in the method mentioned above, the electrode is formed on a region including the element region, the wire bonding region, and two or more inclined side walls including the inclined side wall having the smallest angle of inclination. When a highly anisotropic deposition method, such as vacuum evaporation, is employed for deposition of an electrode metal on the silicon substrate, the thickness of the electrode metal is thinner on the inclined side wall than on the bottom of the recess. Therefore, the maximum level of current flowing through the electrode, i.e., the breakdown current, is lower on the inclined side wall than on other regions. In this method, however, since the electrode is formed over two or more side walls, the width of the electrode on the side walls is increased, whereby a reduction in the breakdown current of the entire electrode is avoided.

According to a fifteenth aspect of the present invention, in the method mentioned above, after formation of the recess and before formation of the electrode, masks are formed on the surface of the silicon substrate outside the recess and on a region at the bottom of the recess including the element region, and the silicon substrate is etched using the masks to form a 5~20 µm high convex portion at the bottom of the recess. In this method, since the semiconductor element is mounted on the convex portion in the recess, the position of the semiconductor element from the bottom of the recess is heightened, whereby irregular reflection of laser light emitted from the semiconductor element at the bottom of the recess is avoided.

According to a sixteenth aspect of the present invention, in the method mentioned above, after formation of the recess and before formation of the electrode, masks are formed on the surface of the substrate outside the recess, on the side wall of the recess having the smallest angle of inclination, and on a region at the bottom of the recess including the element region and adjacent to the side wall having the smallest angle of inclination, and the silicon substrate is etched using the masks, thereby forming a 5~20 µm high convex portion of the substrate at the bottom of the recess and adjacent to the side wall having the smallest angle of inclination. Thereafter, the electrode is formed on a region including the element region on the convex portion, the side wall having the smallest angle of inclination and adjacent to the convex portion, and the wire bonding region at the surface of the substrate outside the recess and adjacent to the side wall having the smallest angle of inclination. In this method, since the convex portion abuts on the inclined side wall on which the electrode is disposed, a step of the convex portion is not present between the inclined side wall and the convex portion. Further, when the convex portion is formed by etching with a resist mask, since the resist mask covers the inclined side wall, an overhanging portion as shown in FIGS. 13(b) and 13(c) is not produced on the side wall. Therefore, unwanted breaking of the electrode between the element region and the wire bonding region is avoided.

DETAILED DESCRIPTION OF THE PREFERRED EMBODIMENTS

[Embodiment 1]

Figure 1:
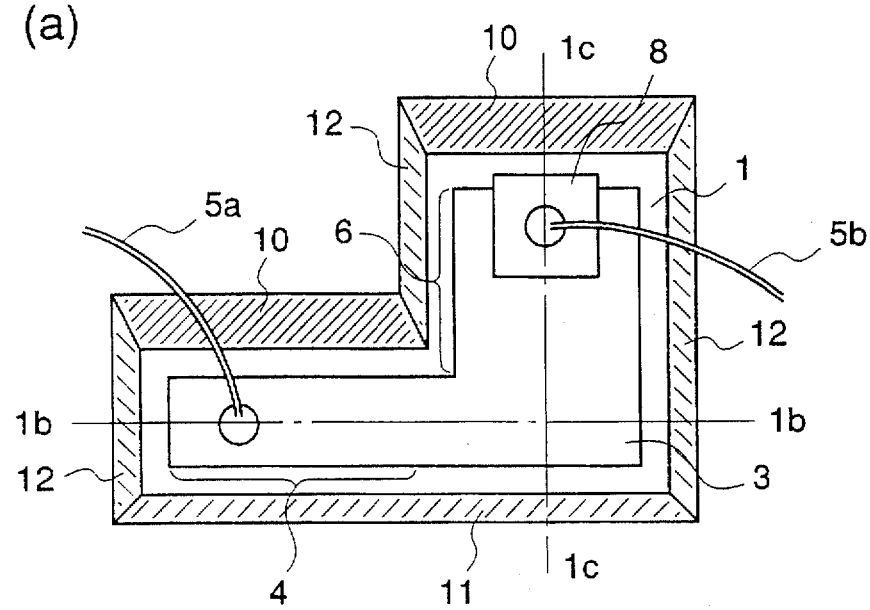
FIG. 1(a) is a plan view illustrating a semiconductor device according to a first embodiment of the present invention.
FIG. 1(b) is a cross-sectional view taken along a line 1b—1b in FIG. 1(a)
FIG. 1(c) is a cross-sectional view taken along a line 1c—1c in FIG. 1(a).
Figure 1:
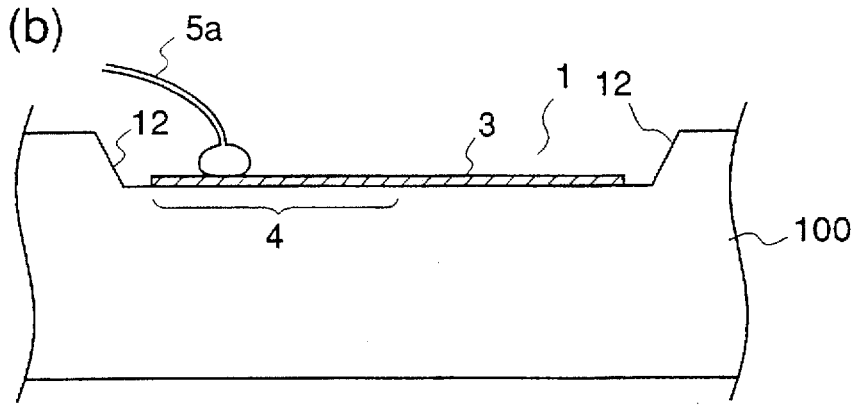
Figure 1:
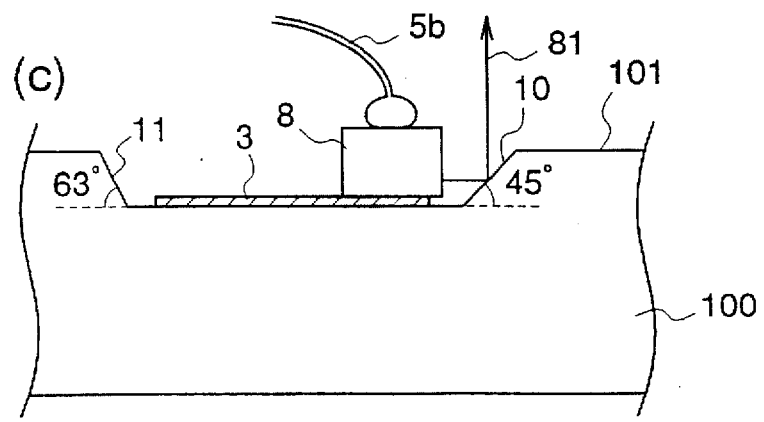
Figure 2:
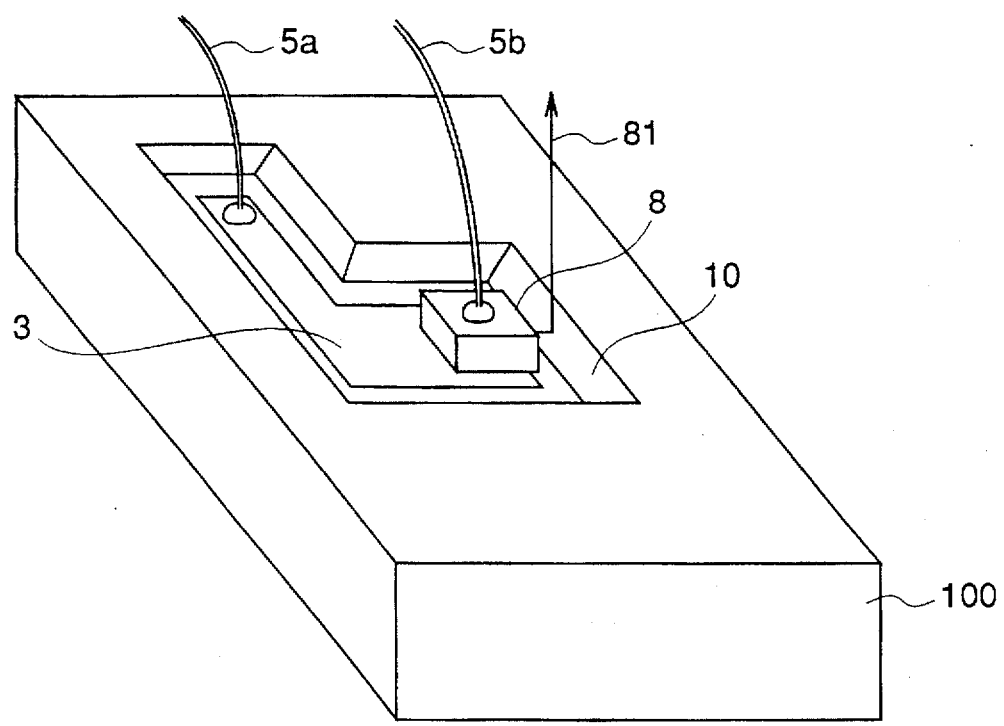
FIG. 2 is a perspective view illustrating the semiconductor device according to the first embodiment of the present invention.

FIG. 1(a) is a plan view illustrating a semiconductor device according to a first embodiment of the present invention, FIG. 1(b) is a cross-sectional view taken along a line 1b—1b in FIG. 1(a), and FIG. 1(c) is a cross-sectional view taken along a line 1c—1c in FIG. 1(a). FIG. 2 is a perspective view of the semiconductor device. In this first embodiment of the invention, a silicon substrate 100 has a surface 101 in a plane that is about 9° off the (100) plane in the 1b—1b direction (hereinafter referred to as a 9° off (100) surface). A recess 1 having a depth of 40 μm is formed at the surface 101 of the substrate 100 by anisotropic etching. Side walls of the recess 1 are composed of inclined planes 10, 11, and 12 which make angles of 45°, 63°, and 54°, respectively, with the bottom of the recess 1 that is parallel to the surface 101 of the substrate 100. An electrode 3 comprising Ti(100 nm)/Au(200 nm) is disposed on the bottom of the recess 1. A laser diode 8 is solder-bonded to a portion of the electrode 3 within a laser diode mounting region (element region) 6, and an Au wire 5a is bonded to a portion of the electrode 3 within a wire bonding region 4. An Au wire 5b is bonded to the top of the laser diode 8. When a forward bias voltage is applied across these wires 5a and 5b and a current flowing through the laser diode 8 exceeds a threshold level, laser oscillation occurs. The direction of laser light 81 emitted from the laser diode 8 is parallel to the bottom of the recess 1 as shown in FIG. 1(c). The laser light 81 is reflected by the 45° inclined plane 10 and becomes perpendicular to the surface of the silicon substrate 100. In this way, the direction of the laser light 81 from the laser diode 8 can be made parallel to the bottom of the recess 1, i.e., to the surface of the silicon substrate 100, so that the laser diode 8 can be mounted on the substrate 100 with the active layer parallel to the surface of the substrate 100, that is, a planar mounting is realized.

Figure 3:
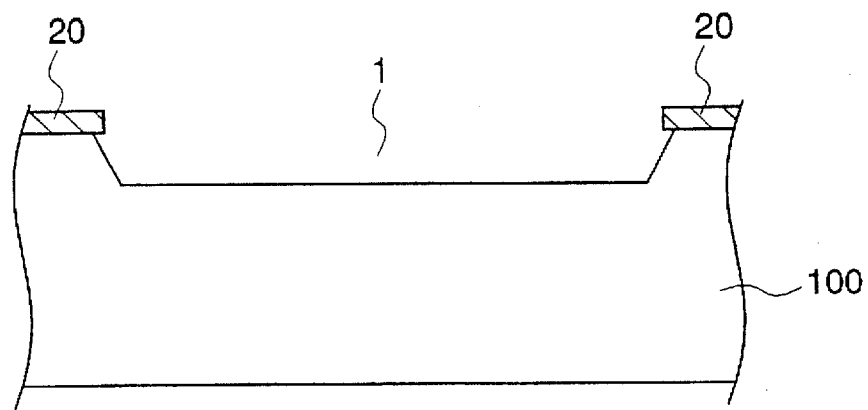
FIGS. 3(a) and 3(b) are cross-sectional views illustrating process steps in a method of fabricating the semiconductor device according to the first embodiment of the present invention.
Figure 3:
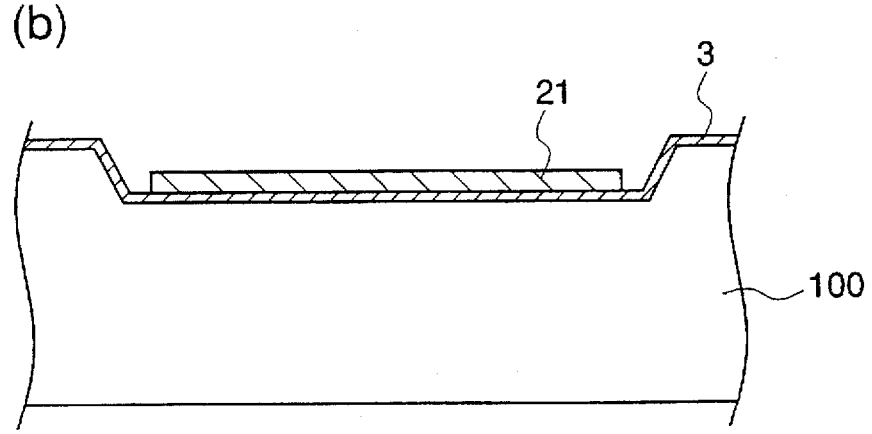

A description is given of a method for fabricating the semiconductor device. Initially, a resist 20 is formed on the 9° off (100) surface of the silicon substrate 100 except a region where a recess is later formed. Using the resist 20 as a mask, the silicon substrate 100 is anisotropically etched to form a recess 1 having a depth of 40 μm (FIG. 3(a)). Preferably, the substrate 100 is etched by wet etching with an aqueous solution of KOH (potassium hydroxide). After removal of the resist 20, a Ti(100 nm)/Au(200 nm) film 3 is deposited over the entire surface of the substrate 100 by vacuum evaporation or sputtering, and a resist 21 is formed on a portion of the Ti/Au film 3 in the recess 1 (FIG. 3(b)). Using the resist 21 as a mask, the Ti/Au film 3 is etched to form an electrode 3. In this etching process, as an etchant for etching Au, aqua regia, a CN-based etchant, or a KI—I$_2$-based etchant is employed. As an etchant for etching Ti, an HF-based etchant is employed. After removal of the resist 21, a laser diode 8 is bonded to a portion of the electrode 3 in the laser diode mounting region 6 with solder. To complete the semiconductor device shown in FIGS. 1(a)–1(c), an Au wire 5a is bonded to a portion of the electrode 3 in the wire bonding region 4, and an Au wire 5b is bonded to the top of the laser diode 8.

In this first embodiment of the invention, the electrode 3 is disposed on the bottom of the recess 1, and there is no step in the region, where the electrode 3 is present, between the laser diode mounting region 6 and the wire bonding region 4. Therefore, unwanted breaking of the electrode 3 in this region is avoided, whereby degradation of characteristics due to breaking of the electrode is avoided.

[Embodiment 2]

Figure 4:
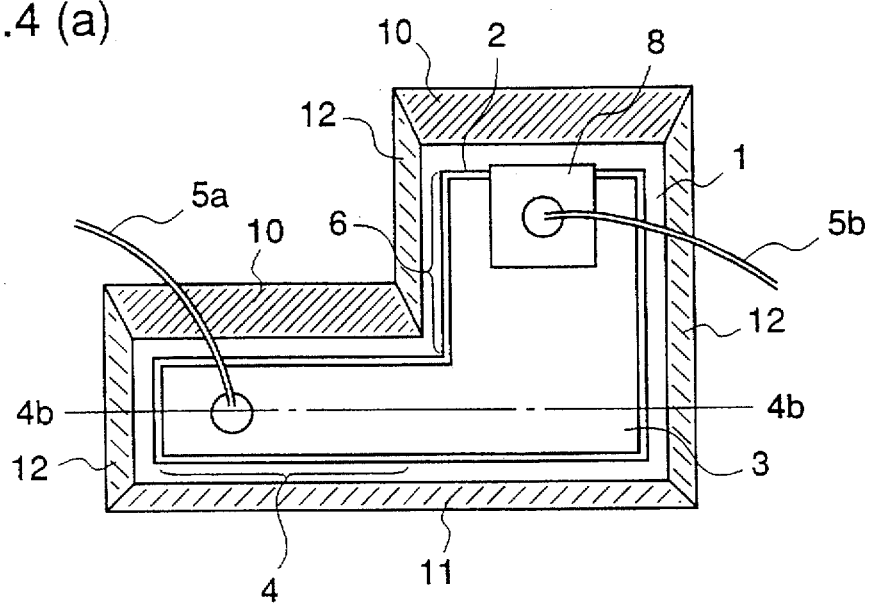
FIG. 4(a) is a plan view illustrating a semiconductor device according to a second embodiment of the present invention and FIG. 4(b) is a cross-sectional view taken along a line 4b—4b in FIG. 4(a).
Figure 4:
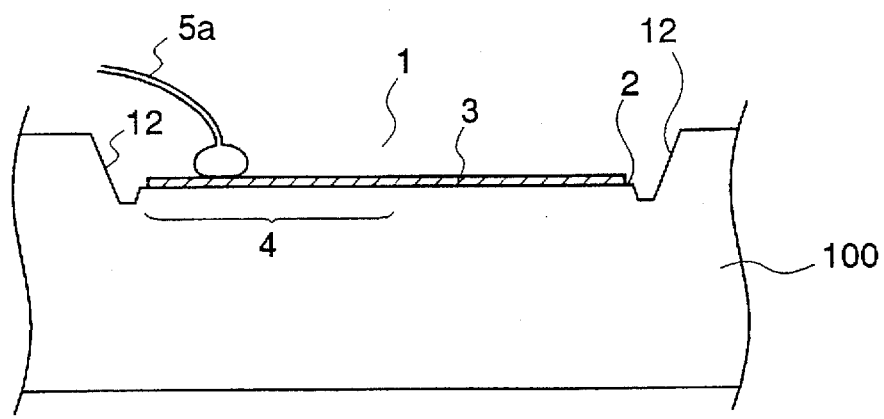

FIG. 4(a) is a plan view illustrating a semiconductor device according to a second embodiment of the present invention, and FIG. 4(b) is a cross-sectional view taken along a line 4b—4b in FIG. 4(a). In these figures, the same reference numerals as those shown in FIGS. 1(a)–1(c) designate the same or corresponding parts. The semiconductor device according to this second embodiment is fundamentally identical to the semiconductor device according to the first embodiment except that the substrate 100 has a 10 μm high convex portion 2 at the bottom of the recess 1 and the electrode 3 is disposed on the surface of the convex portion 2. Also in this semiconductor device, laser light emitted from the laser diode 8 is reflected by the 45° inclined plane 10 and becomes perpendicular to the surface of the substrate 100.

Figure 5:
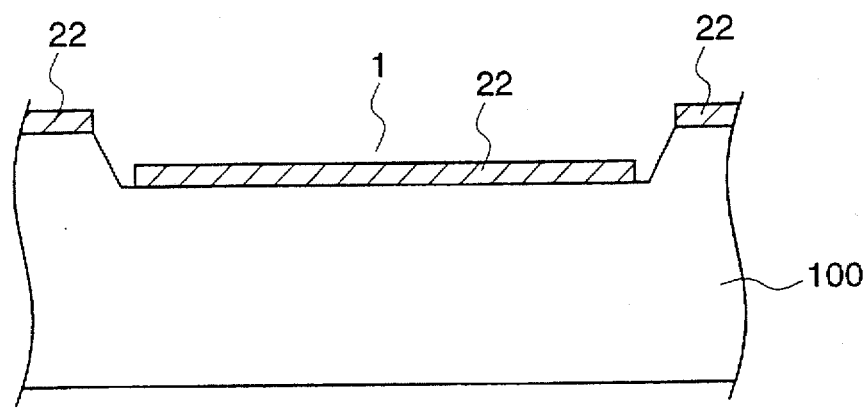
FIGS. 5(a) and 5(b) are cross-sectional views illustrating process steps in a method of fabricating the semiconductor device according to the second embodiment of the present invention.
Figure 5:
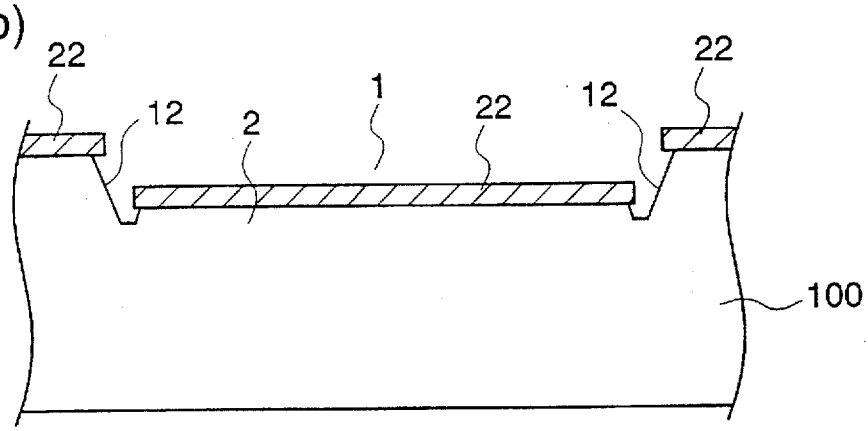

A description is given of a method of fabricating the semiconductor device. Initially, a recess 1 is formed at the surface of the silicon substrate 100 in the same process as already described with respect to FIG. 3(a). Thereafter, as illustrated in FIG. 5(a), a resist 22 is formed on the surface of the silicon substrate 100 outside the recess 1 and on a region of the bottom of the recess 1 where a convex portion 2 is later formed. Using the resist 22 as a mask, the silicon substrate 100 is etched to a depth of 10 μm from the bottom of the recess 1, as shown in FIG. 5(b). As a result of the etching, a 10 μm high convex portion 2 is produced at the bottom of the recess 1. After removal of the resist 22, an electrode 3 is formed on the convex portion 2 in the recess 1 using the same method as described for the first embodiment. To complete the semiconductor device shown in FIGS. 4(a) and 4(b), a laser diode 8 is mounted and Au wires 5a and 5b are bonded.

In this second embodiment of the invention, the electrode 3 is disposed on the convex portion 2 in the recess 1, and there is no step in the region, where the electrode 3 is present, between the laser diode mounting region 6 and the wire bonding region 4. Therefore, unwanted breaking of the electrode 3 in this region is avoided. Further, since the laser diode 8 is mounted on the convex portion 2 in the recess 1, the position of the laser diode 8 from the bottom of the recess 1 is higher than that in the semiconductor device according to the first embodiment, so that irregular reflection of laser light emitted from the laser diode 8 at the bottom of the recess 1 is avoided.

[Embodiment 3]

Figure 6:
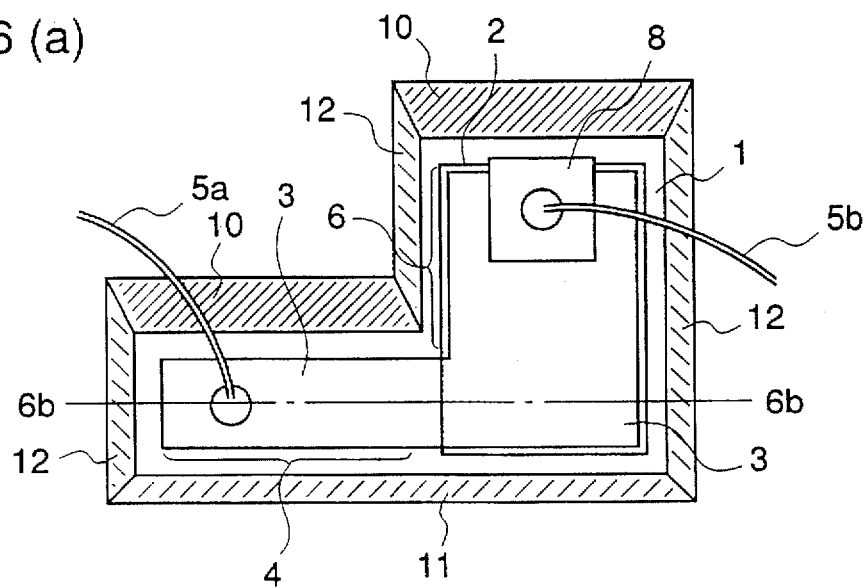
FIG. 6(a) is a plan view illustrating a semiconductor device according to a third embodiment of the present invention and FIG. 6(b) is a cross-sectional view taken along a line 6b—6b in FIG. 6(a).
Figure 6:
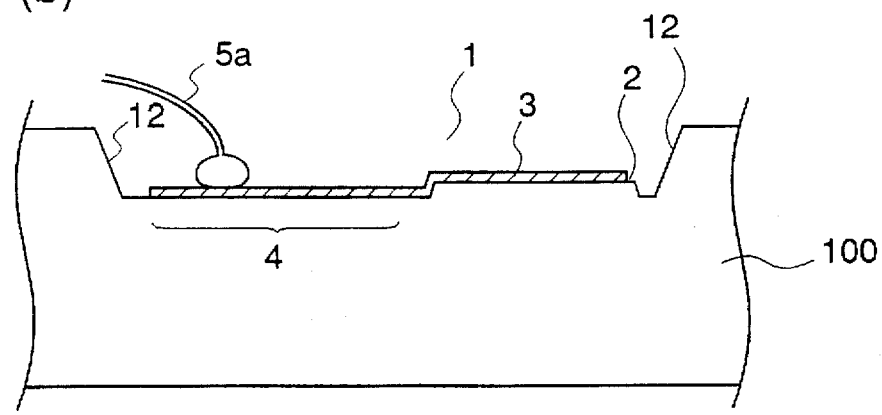

FIG. 6(a) is a plan view illustrating a semiconductor device according to a third embodiment of the present invention, and FIG. 6(b) is a cross-sectional view taken along a line 6b—6b in FIG. 6(a). In these figures, the same reference numerals as those shown in FIGS. 4(a) and 4(b) designate the same or corresponding parts. The semiconductor device according to this third embodiment is fundamentally identical to the semiconductor device according to the second embodiment except that the 10 μm high convex portion 2 of the substrate is absent in the wire bonding region 4, and the electrode 3 is disposed on the convex portion 2 and on the wire bonding region 4 at the bottom of the recess 1. Also in this semiconductor device, laser light emitted from the laser diode 8 is reflected by the 45° inclined plane 10 and becomes perpendicular to the surface of the substrate 100.

The process steps for fabricating the semiconductor device according to this third embodiment are identical to those already described for the second embodiment except that the convex portion 2 is formed in a region of the bottom of the recess 1 other than the wire bonding region 4. More specifically, in the step shown in FIG. 5(a), the resist mask 22 is formed on a region of the bottom of the recess 1 other than the wire bonding region 4.

In this third embodiment of the invention, since the electrode 3 is not disposed on the inclined side wall of the recess 1, unwanted breaking of the electrode 3 at this portion is avoided. Further, the convex portion 2 is not present in the wire bonding region 4 and, in this wire bonding region 4, the electrode 3 is disposed on the flat surface at the bottom of the recess 1. Therefore, the resist 21 serving as a mask for patterning the electrode 3 does not remain on the periphery of the electrode 3 in the wire bonding region 4, whereby the patterning precision of the electrode 3 is improved.

[Embodiment 4]

Figure 7:
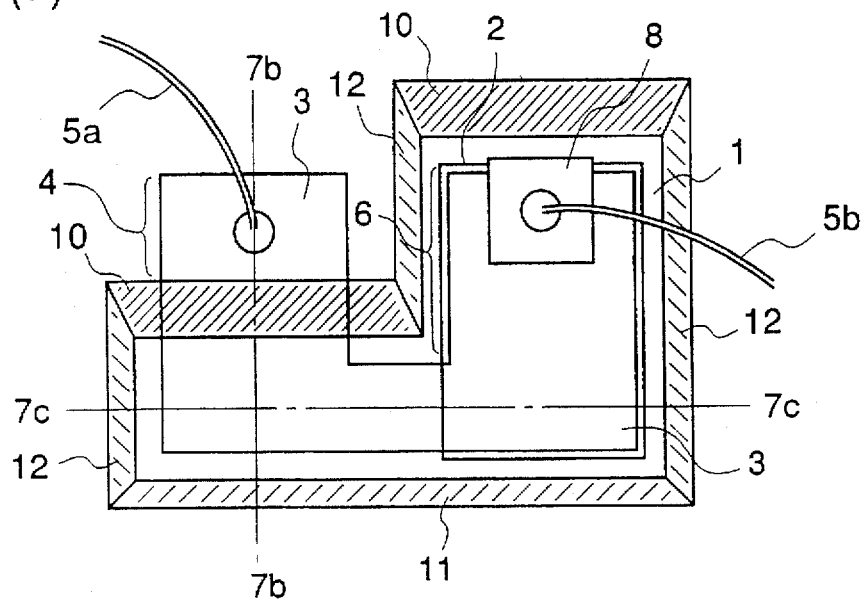
FIG. 7(a) is a plan view illustrating a semiconductor device according to a fourth embodiment of the present invention.
FIG. 7(b) is a cross-sectional view taken along a line 7b—7b in FIG. 7(a)
FIG. 7(c) is a cross-sectional view taken along a line 7c—7c in FIG. 7(a).
Figure 7:
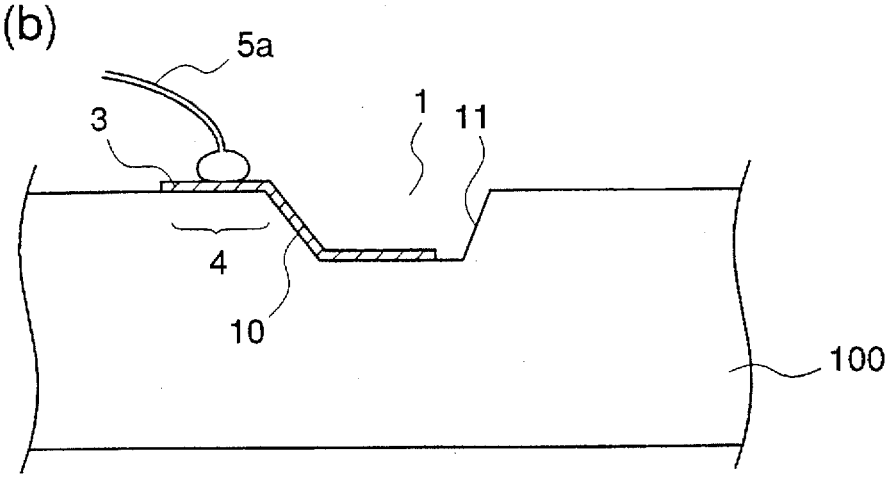
Figure 7:
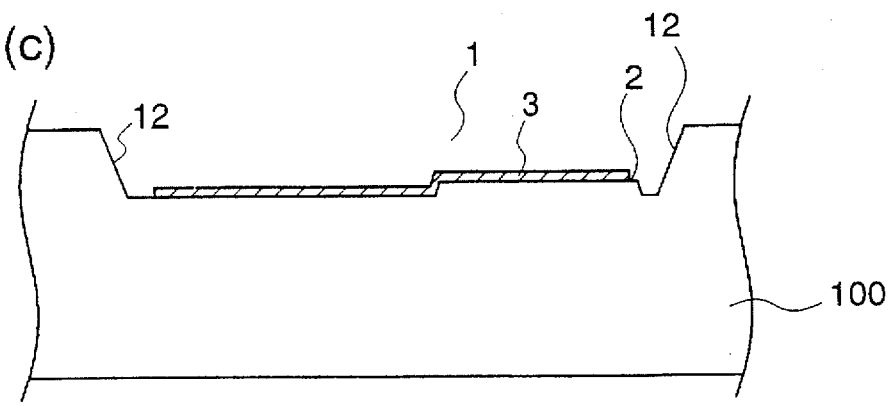

FIG. 7(a) is a plan view illustrating a semiconductor device according to a fourth embodiment of the present invention, FIG. 7(b) is a cross-sectional view taken along a line 7b—7b in FIG. 7(a), and FIG. 7(c) is a cross-sectional view taken along a line 7c—7c in FIG. 7(a). In these figures, the same reference numerals as those shown in FIGS. 1(a)–1(c) designate the same or corresponding parts. In this fourth embodiment, a silicon substrate 100 has a 40 μm deep recess 1 and a 10 μm high convex portion 2 in the recess 1, and an electrode 3 is disposed on a region of the substrate including a laser diode mounting region 6 on the convex portion 2 and a wire bonding region 4 on the surface of the substrate outside the recess 1. A laser diode 8 is mounted on a portion of the electrode 3 in the laser diode mounting region 6, and a wire 5a is bonded to a portion of the electrode 3 in the wire bonding region 4. Further, the side wall 10 of the recess 1 across which the electrode 3 is disposed between the wire bonding region 4 and the laser diode mounting region 6 has the smallest angle of inclination, 45°. That is, the slope of the side wall 10 is gentler than the slopes of the side walls 11 and 12.

Also in this semiconductor device, laser light emitted from the laser diode 8 is reflected by the 45° inclined plane facing the laser diode and becomes perpendicular to the surface of the substrate 100. Further, the laser diode 8 is mounted on the convex portion 2 to prevent laser light emitted from the diode 8 from being irregularly reflected at the bottom of the recess 1.

Figure 8:
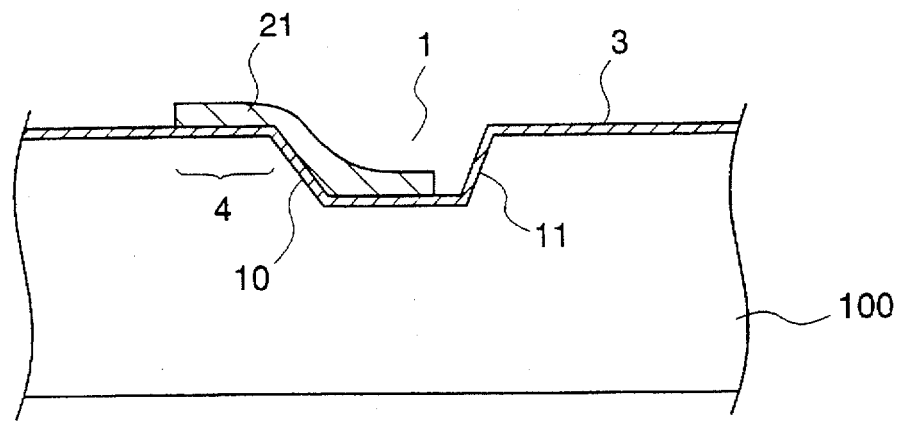
FIG. 8 is a cross-sectional view illustrating a process step in a method of fabricating the semiconductor device according to the fourth embodiment of the present invention.

A description is given of a method for producing the semiconductor device according to this fourth embodiment. FIG. 8 is a cross-sectional view illustrating a process step in the method, taken along the line 7c—7c in FIG. 7(a). The process steps for producing the recess 1 and the convex portion 2 according to this fourth embodiment are identical to those already described for the third embodiment of the invention. After the recess 1 and the convex portion 2 are produced, an electrode metal film 3 comprising Ti(100 nm)/Au(200 nm) is deposited over the entire surface. Thereafter, as shown in FIG. 8, a resist 21 is formed on the metal film 3 in a region including the surface of the convex portion 2, the wire bonding region 4 outside the recess 1, and the 45° inclined surface 10. Using the resist 21 as a mask, the metal film 3 is etched to form an electrode 3 as shown in FIGS. 7(a)–7(c). As the resist 21, a multilayer resist or a high viscosity resist is employed.

Figure 13:
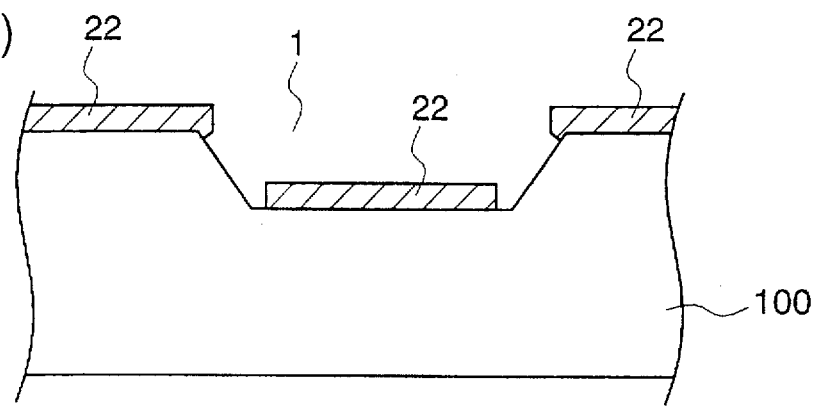
FIGS. 13(a)–13(d) are cross-sectional views illustrating process steps in a method of fabricating the prior art semiconductor device.
Figure 13:
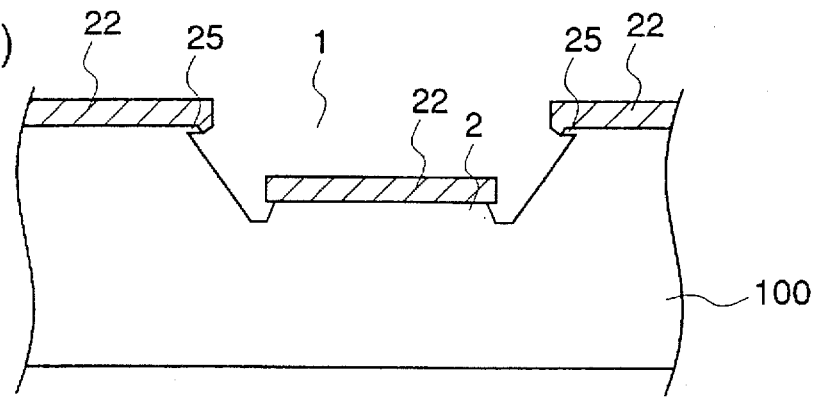
Figure 13:
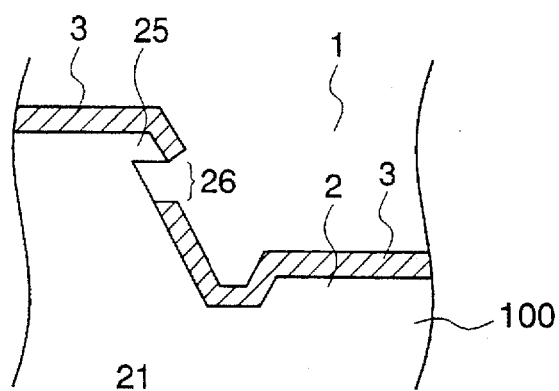
Figure 13:
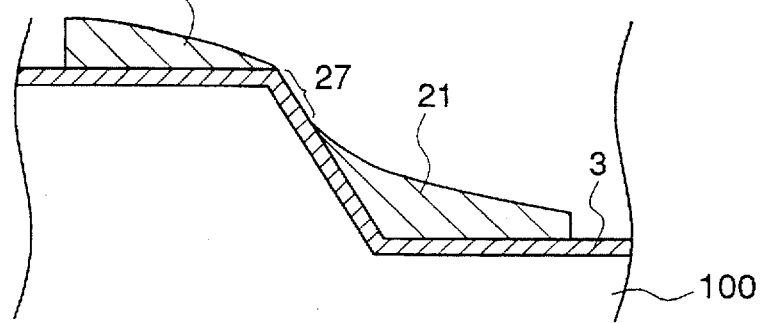

In this fourth embodiment of the invention, the side wall 10 of the recess 1 across which the electrode 3 is disposed has the smallest angle of inclination, i.e., 45°. Therefore, when the electrode is produced by etching the electrode metal film 3 using the resist mask 21 as shown in FIG. 8, since the coverage of the resist 21 on the 45° inclined side wall 10 is satisfactory, undesired exposure of the metal film on the side wall 10 as shown in FIG. 13(d) is avoided. As a result, breaking of the electrode 3 on the side wall 10 is avoided.

[Embodiment 5]

Figure 9:
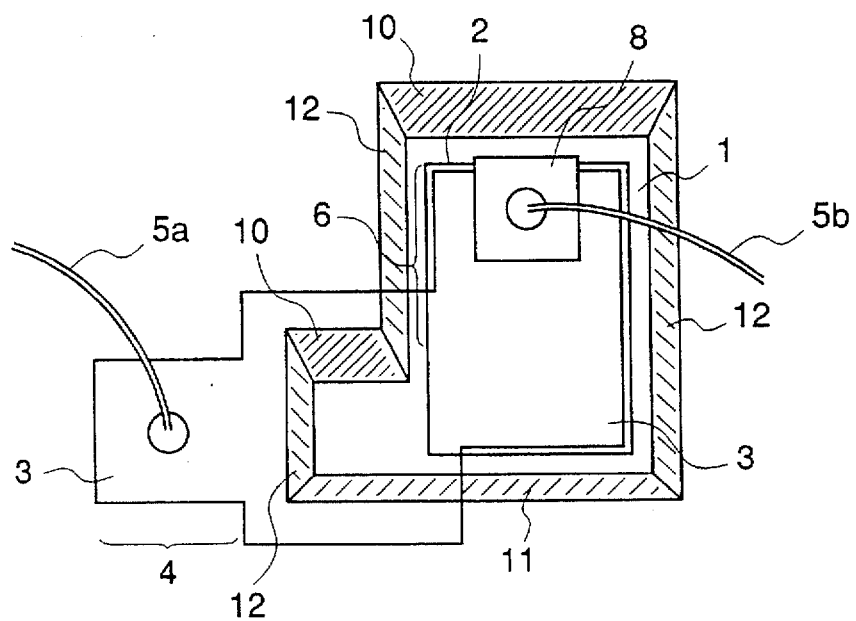
FIG. 9 is a plan view illustrating a semiconductor device according to a fifth embodiment of the present invention.

FIG. 9 is a plan view illustrating a semiconductor device according to a fifth embodiment of the present invention. In the figure, the same reference numerals as those shown in FIGS. 1(a)–1(c) designate the same or corresponding parts. The semiconductor device according to this fifth embodiment is identical to the semiconductor device according to the fourth embodiment in that the substrate 100 has the convex portion 2 in the recess 1 and the electrode 3 is disposed on a region including the laser diode mounting region 6 on the convex portion 2 and the wire bonding region outside the recess 1, but different from the semiconductor device according to the fourth embodiment in that the electrode 3 is disposed across the 45° inclined side wall 10, the 63° inclined side wall 11, and the 54° inclined side wall 12, between the laser diode mounting region 6 and the wire bonding region 4.

Also in this semiconductor device, laser light emitted from the laser diode 8 is reflected by the 45° inclined plane facing the laser diode and becomes perpendicular to the surface of the substrate 100. Further, the laser diode 8 is mounted on the convex portion 2 to prevent laser light emitted from the diode 8 from being irregularly reflected at the bottom of the recess 1.

The process steps for fabricating the semiconductor device according to this fifth embodiment are identical to those already described for the fourth embodiment except that the resist mask 21 is formed on the electrode metal film 3, extending on the surface of the substrate outside the recess 1 across the three side walls in the recess, i.e., the 45° inclined side wall 10, the 63° inclined side wall 11, and the 54° inclined side wall 12.

When a highly anisotropic deposition method, such as vacuum evaporation, is employed for deposition of the electrode metal film 3 on the silicon substrate 100, the electrode metal film 3 is thinner on the inclined side wall in the recess 1 than on the bottom of the recess 1 and on the surface of the silicon substrate 100 outside the recess 1. Therefore, the maximum level of current flowing through the electrode 3, i.e., the breakdown current, is lower on the inclined side wall than on the other regions.

In this fifth embodiment of the invention, since the electrode 3 is disposed over the continuous three side walls 10, 11, and 12, the width of the electrode 3 on the side walls is increased. Therefore, a reduction in the breakdown current of the entire electrode 3 is avoided.

[Embodiment 6]

Figure 10:
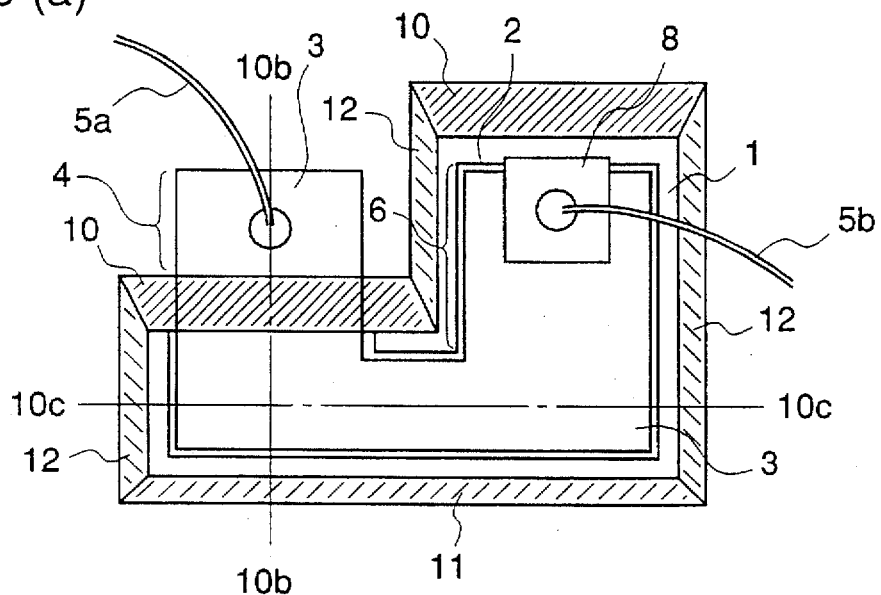
FIG. 10(a) is a plan view illustrating a semiconductor device according to a sixth embodiment of the present invention.
FIG. 10(b) is a cross-sectional view taken along a line 10b—10b in FIG. 10(a)
FIG. 10(c) is a cross-sectional view taken along a line 10c—10c in FIG. 10(a).
Figure 10:
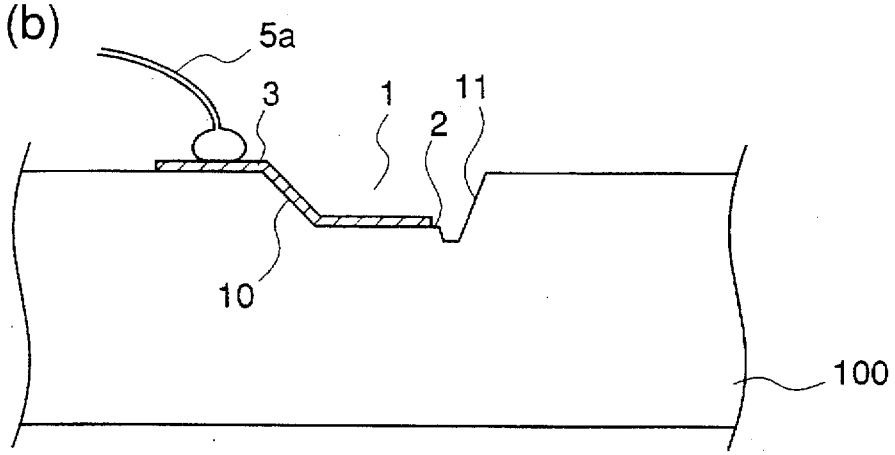
Figure 10:
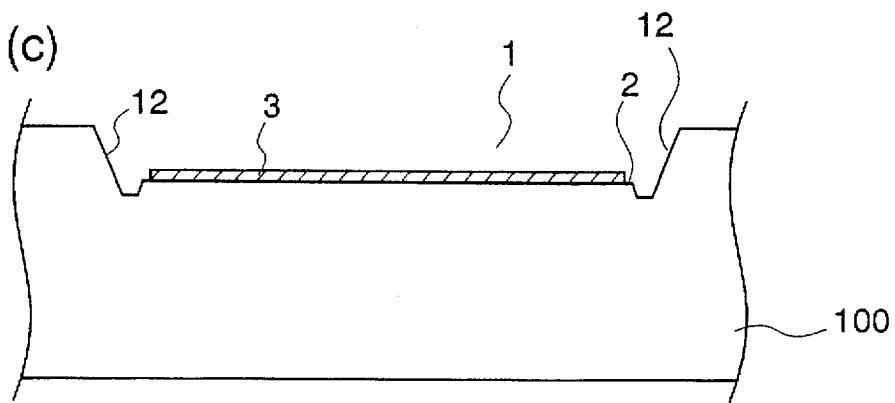

FIG. 10(a) is a plan view illustrating a semiconductor device according to a sixth embodiment of the present invention, FIG. 10(b) is a cross-sectional view taken along a line 10b—10b in FIG. 10(a), and FIG. 10(c) is a cross-sectional view taken along a line 10c—10c in FIG. 10(a). The semiconductor device according to this sixth embodiment is identical to the semiconductor device according to the fourth embodiment in that the substrate 100 has the convex portion 2 in the recess 1 and the electrode 3 is disposed on the laser diode mounting region 6 on the convex portion 2 and on the wire bonding region outside the recess 1 across the 45° inclined side wall 10 in the recess 1, but different from the semiconductor device according to the fourth embodiment in that the convex portion 2 of the substrate in the recess 1 abuts the 45° inclined side wall 10.

Also in this semiconductor device, laser light emitted from the laser diode 8 is reflected by the 45° inclined plane facing the laser diode and becomes perpendicular to the surface of the substrate 100. Further, the laser diode 8 is mounted on the convex portion 2 to prevent laser light emitted from the diode 8 from being irregularly reflected at the bottom of the recess 1.

Figure 11:
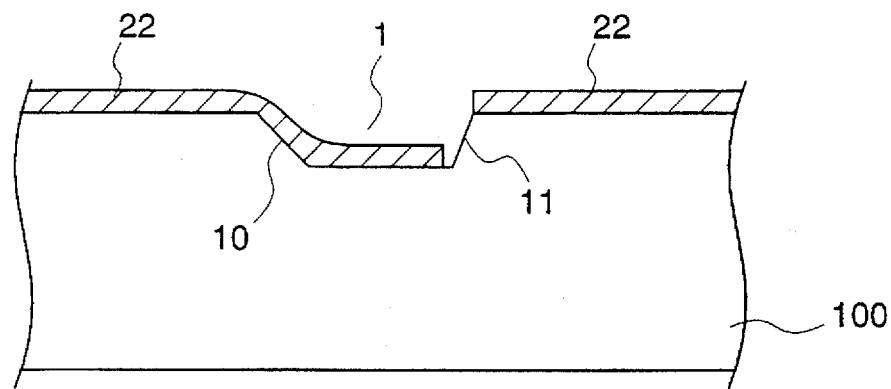
FIGS. 11(a) and 11(b) are cross-sectional views illustrating process steps in a method of fabricating the semiconductor device according to the sixth embodiment of the present invention.
Figure 11:
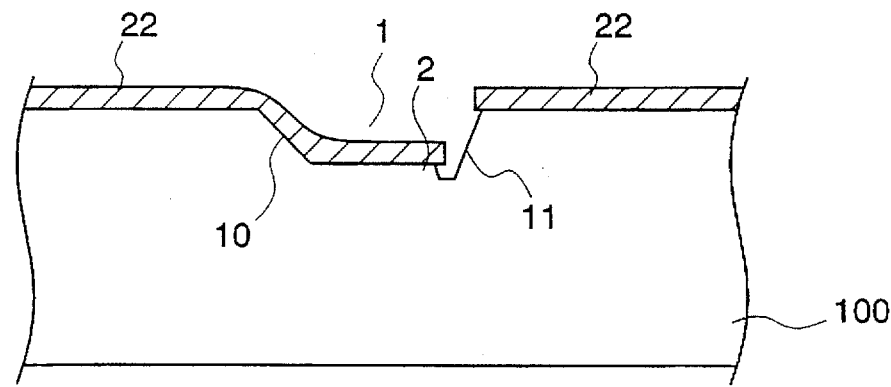
Figure 12:
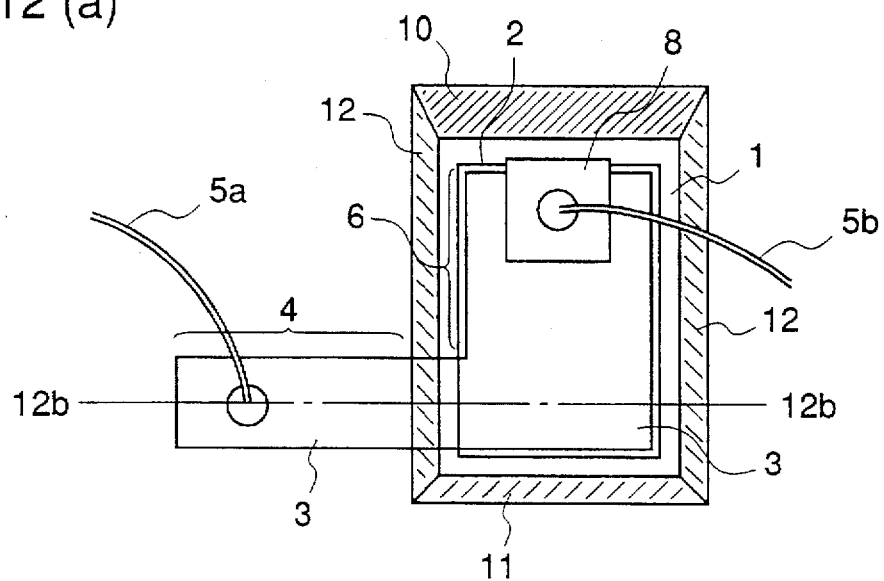
FIG. 12(a) is a plan view illustrating a semiconductor device according to the prior art.
FIG. 12(b) is a cross-sectional view taken along a line 12b—12b in FIG. 12(a).
Figure 12:
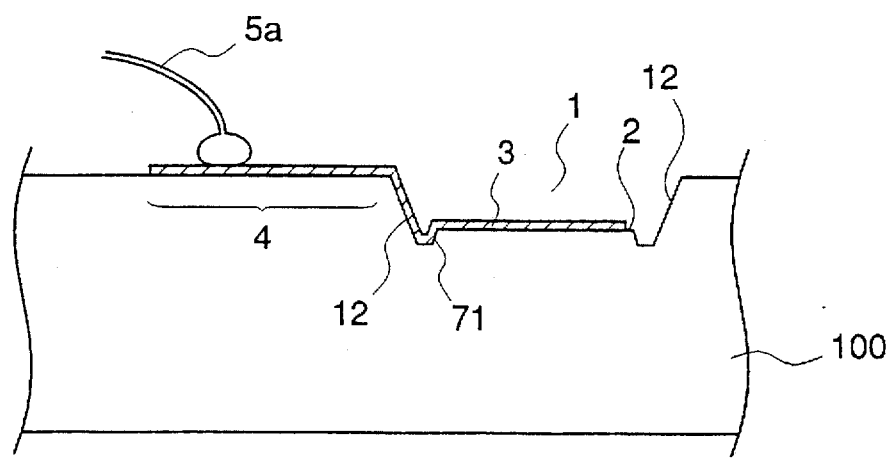

FIGS. 11(a) and 11(b) are cross-sectional views illustrating process steps in a method of fabricating the semiconductor device shown in FIGS. 10(a)-10(c), taken along the line 10b—10b in FIG. 10(a). Initially, a recess 1 is formed at the surface of the silicon substrate 100 in the same process as described for the first embodiment of the invention. Thereafter, as illustrated in FIG. 11(a), a resist 22 is formed on the surface of the substrate 100 outside the recess 1, on a region of the bottom of the recess 1 where a convex portion 2 is later formed, and on a region of the 45° inclined side wall 10 where an electrode 3 is later produced. The resist 22 should be continuous over the bottom of the recess 1, the 45° inclined side wall of the recess 1, and the surface of the substrate 100 outside the recess 1. Further, as shown in FIG. 11(b), using the resist 22 as a mask, the silicon substrate 100 is etched to form a convex portion 2 contacting the 45° inclined side wall 10. Thereafter, an electrode 3 is formed in the same process as described for the fourth embodiment, followed by mounting of a laser diode 8 and bonding of wires 5a and 5b.

In this sixth embodiment of the invention, since the convex portion 2 abuts the 45° inclined side wall where the electrode 3 is disposed, a step of the convex portion 2 is not present between the 45° inclined side wall 10 and the convex portion 2. Further, when the convex portion 2 is formed by etching, since the resist 22 covers the side wall 10, an overhanging portion as shown in FIGS. 13(b) and 13(c) is not produced on the side wall 10. Therefore, unwanted breaking of the electrode 3 between the laser diode mounting region 6 and the wire bonding region 4 is avoided.

What is claimed is:

1. A semiconductor device comprising:

a silicon substrate having a surface and a recess 20–150 μm deep at the surface, the recess having a bottom and a plurality of side walls;

an electrode disposed on a region at the bottom of the recess, the region including an element region where a semiconductor element is mounted and a wire bonding region where a wire is bonded;

a semiconductor element mounted on a portion of the electrode within the element region; and a wire bonded to a portion of the electrode within the wire bonding region.

2. The semiconductor device of claim 1 wherein the substrate has a convex region 5–20 μm high in the recess, and the electrode is disposed on the convex portion.

3. The semiconductor device of claim 1 wherein:

the substrate has a convex region 5–20 μm high in the recess;

the electrode is disposed on the bottom of the recess including the convex portion;

the semiconductor element is mounted on a portion of the electrode on the convex portion; and the wire is bonded to a portion of the electrode outside the convex portion.

4. The semiconductor device of claim 1 wherein:

the surface of the silicon substrate is in a plane that is about 9° off a (100) plane;

the side walls of the recess are inclined planes including a plane forming an angle of 45° with the bottom of the recess; and the semiconductor element is a semiconductor light emitting element mounted on the electrode at such a position that light emitted from the element is parallel to the bottom of the recess and reflected at the 45° inclined plane to be perpendicular to the surface of the silicon substrate.

5. A semiconductor device comprising:

a silicon substrate having a surface in a plane about 9° off a (100) plane, and a recess 20–150 μm deep at the surface, the recess having a bottom and a plurality of side walls having respective angles of inclination with respect to the bottom of the recess;

an electrode disposed on a region including an element region at the bottom of the recess where a semiconductor element is to be mounted, on a wire bonding region at the surface of the substrate outside the recess where a wire is to be bonded, and on the side wall having the smallest of the angles of inclination with respect to the bottom of the recess;

a semiconductor element mounted on a portion of the electrode within the element region; and a wire bonded to a portion of the electrode within the wire bonding region.

6. The semiconductor device of claim 5 wherein the electrode is disposed on a region including the element region, the wire bonding region, and at least two side walls of the recess including the side wall having the smallest angle of inclination.

7. The semiconductor device of claim 5 wherein:

the substrate has a convex portion 5~20 μm high in the recess; and the element region is on the convex portion.

8. The semiconductor device of claim 5 wherein:

the substrate has a convex portion 5~20 μm high at the bottom of the recess, the convex portion abutting the side wall having the smallest angle of inclination; and the electrode is disposed on the element region on the convex portion, the side wall having the smallest angle of inclination and adjacent to the convex portion, and a wire bonding region at the surface of the substrate outside the recess and adjacent to the side wall having the smallest angle of inclination.

9. The semiconductor device of claim 1 wherein the recess has a shape in the surface of the substrate of two intersecting legs and the element region and wire bonding regions are located in different legs.

10. The semiconductor device of claim 5 wherein the recess has a shape in the surface of the substrate of two intersecting legs and the element region and wire bonding regions are located in different legs.

* * * * *